(12) United States Patent  (10) Patent No.: US 6,391,789 B2
Sango  (45) Date of Patent: May 21, 2002

(54) DRY ETCHING SYSTEM FOR PATTERNING TARGET LAYER AT HIGH REPRODUCIBILITY AND METHOD OF DRY ETCHING USED THEREIN

(75) Inventor: Toshiaki Sango, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/836,649

(22) Filed: Apr. 17, 2001

(30) Foreign Application Priority Data

Apr. 19, 2000 (JP) .................................... 2000-118275

(51) Int. Cl.[7] ........................................... H01L 21/302
(52) U.S. Cl. ........................... 438/714; 438/729; 438/5; 438/10; 216/67; 216/71; 216/60; 216/61
(58) Field of Search .............................. 216/67, 71, 60, 216/61; 438/5, 10, 714, 729

(56) References Cited

U.S. PATENT DOCUMENTS 6,084,763 A * 7/2000 Hirano et al. ............... 361/234
6,188,564 B1 * 2/2001 Hao ........................... 361/234
6,273,023 B1 * 8/2001 Tsuchihashi et al. ...... 118/723 E
2001/0025691 A1 * 10/2001 Kanno et al. ............... 156/345

FOREIGN PATENT DOCUMENTS

| JP | 62-290133 | 12/1987 |
| JP | 6-170670 | 6/1994 |
| JP | 10-14266 | 1/1998 |
| WO | 00/58994 | 10/2000 |

* cited by examiner

Primary Examiner—George Goudreau
(74) Attorney, Agent, or Firm—Dickstein Shapiro Morin & Oshinsky LLP

(57) ABSTRACT

A dry etching is carried out for a single semiconductor wafer electrostatically attracted to a static chuck in the presence of a plasma, wherein a controlling system applies a relatively large direct current voltage to the static chuck when a lapse of time from the previous dry etching is longer than a critical lapse of time and when a place occupied by the single semiconductor wafer in a lot is equal to or less than a critical place so that micro-contact holes formed over the semiconductor wafers in the lot are fallen within a target diameter range.

9 Claims, 3 Drawing Sheets

DRY ETCHING SYSTEM FOR PATTERNING TARGET LAYER AT HIGH REPRODUCIBILITY AND METHOD OF DRY ETCHING USED THEREIN

FIELD OF THE INVENTION

This invention relates to dry etching technologies used in a process for fabricating semiconductor devices and, more particularly, to a dry etching system and a method of dry etching.

DESCRIPTION OF THE RELATED ART

Various kinds of dry etching systems have been proposed for transferring a photo-resist etching mask to semiconductor wafers. These dry etching systems are broken down into two categories. The first category is featured by concurrently treating a lot of semiconductor wafers with etching gas. On the other hand, only one semiconductor wafer is treated with etching gas in the dry etching system of the second category. The dry etching in the first category is a kind of batch process, and the dry etching in the second category is called as a single wafer processing. Although a high throughput is achieved by the dry etching system of the first category, it is difficult to uniformly etch the material on the plural semiconductor wafers. On the other hand, the dry etching system of the second category is lower in the throughput than the dry etching system of the first category: However, the etching is well controlled on the single semiconductor wafer. For this reason, when a semiconductor manufacturer is to form micro-contact holes in material layers on plural semiconductor wafers, the semiconductor manufacturer usually employs the dry etching system of the second category for the micro-contact holes, because the uniformity is the important factor in the formation of the micro-contact holes among the plural semiconductor wafers.

A typical example of the dry etching system of the second category has an upper electrode and an electrostatic stage in the etching chamber. Plural gas outlet holes are formed in the upper electrode, and a gas supply system is connected to the plural gas outlet holes. The electrostatic stage is opposed to the upper electrode, and a single semiconductor wafer is to be electrostatically fixed to the upper surface of the electrostatic stage.

Micro-contact holes are formed in an insulating layer over a single semiconductor wafer as follows. First, photo-resist solution is spun onto the single semiconductor wafer, and is baked so as to form a photo-resist layer on the insulating layer. A pattern image for the micro-contact holes is optically transferred from a photo-mask to the photo-resist layer, and a latent image is produced in the photo-resist layer. When the latent image is developed, a photo-resist etching mask is left on the insulating layer. Predetermined surface areas of the insulating layer are exposed to the holes formed in the photo-resist etching mask, and the micro-contact holes are to be opened to the predetermined surface areas.

The single semiconductor wafer is conveyed into the etching chamber, and is placed on the electrostatic stage. Direct current voltage or electrostatic charge voltage is applied thereto. Then, the single semiconductor wafer is electrostatically attracted to the electrostatic stage. Vacuum is developed in the etching chamber, and the etching chamber is maintained at predetermined vacuum. Process gas is introduced into the etching chamber, and high-frequency electric power is applied between the upper electrode and the lower electrode. Then, plasma is created, and the predetermined surface areas are subjected to the ion-bombardment. However, the remaining surface area is covered with the photo-resist etching mask, and is free from the ion-bombardment. As a result, the insulating layer is partially etched away, and the micro-contact holes are formed in the insulating layer.

However, a problem is encountered in the prior art dry etching method carried out in the dry etching system of the second category in poor reproducibility of the micro-contact holes. FIG. 1 shows an experiment carried out by the present inventor. The present inventor formed the photo-resist etching masks for the micro-contact holes over semiconductor wafers, and the photo-resist etching masks had the same pattern for the micro-contact holes. The micro-contact holes were formed through the prior art dry etching in order, and the present inventor measured the diameter of the micro-contact holes. The micro-contact holes of the first semiconductor wafer had the diameter greater than L7. The micro-contact holes of the second semiconductor wafer had the diameter between L6 and L7. The micro-contact holes of the third semiconductor wafer had the diameter greater than that of the second semiconductor wafer. The diameter of the micro-contact holes of the fourth/fifth semiconductor wafers were approximately equal to that of the third semiconductor wafer. Thus, the prior art dry etching resulted in that the micro-contact holes got small after the initial stage. This tendency was serious if the prior art dry etching system remained stopping for a long time period.

There are several reasons for the poor reproducibility. One of the reasons is low temperature at the initial stage of the prior art dry etching due to poor electrostatic attraction between the electrostatic stage and the semiconductor wafer. When the dry etching is carried out in the low temperature, the ion-bombardment tends to be concentrated to the periphery of the semiconductor wafer, and enlarge the micro-contact holes in the periphery of the semiconductor wafer.

In order to enhance the reproducibility of the micro-contact holes, dummy wafers are used in the initial stage when the temperature is rising. When the temperature gets stable, the dummy wafer is changed to a semiconductor wafer, and the micro-contact holes are formed on the semiconductor wafer. However, the dummy wafers result in a low throughput, and the solution is not desirable.

Another solution is disclosed in Japanese Patent Publication of Unexamined Application (laid-open) No. 6-170670. According to the Japanese Patent Publication of Unexamined Application, the dry etching system disclosed therein is equipped with a static chuck on the lower electrode. A pressure sensor and a temperature sensor are provided for the static chuck. The pressure sensor is embedded in the static chuck, and the electrostatic attraction between the semiconductor wafer and the static chuck is monitored by the pressure sensor. While the dry etching is being carried out in the plasma, the pressure sensor and the temperature sensor report the actual pressure and the actual temperature to a controller. When the controller is noticed that the etching condition is varied, the static chuck changes the electrostatic attraction to the semiconductor wafer and/or the temperature is varied. The reproducibility is a little bit improved in the prior art dry etching system disclosed in the Japanese Patent Publication of Unexamined Application. However, the effect is not drastic. This is because of the fact that the pressure sensor is less reliable in high the temperature ambience under the ion-bombardment. This means that the static chuck changes the electrostatic attraction on the basis of inaccurate detection.

SUMMARY OF THE INVENTION

It is therefore an important object of the present invention to provide a dry etching system, which achieves good reproducibility without sacrifice of the throughput.

It is also an important object of the present invention to provide a dry etching method, which is used in the dry etching system.

The present inventor contemplated the problem inherent in the prior art dry etching. The present inventor investigated the influence of the direct current voltage or the electric static charge applied to the static chuck on the contact holes. The present inventor formed photo-resist etching masks on layers deposited over semiconductor wafers, respectively. The photo-resist etching masks had a pattern for micro-contact holes to be formed in the central areas of the layers as well as micro-contact holes to be formed in the peripheral areas of the layers. The present inventor carried out the dry etching under the direct current voltage varied together with the semiconductor wafers. The present inventor measured the diameter of the micro-contact holes formed in the layers on the semiconductor wafers. The values of the diameter were plotted in FIG. 2 in terms of the direct current voltage. The direct current voltage is abbreviated as "ESC" voltage in FIG. 2.

The present inventor firstly noticed that the direct current voltage was less influential on the micro-contact holes formed in the central areas of the layers. Another discovery was that the diameter of the micro-contact holes was decreased in reverse to the direct current voltage ESC.

The present inventor investigated the different tendencies, and supposed that helium to transfer the heat between the central area and the peripheral area insufficiently. In detail, a heater was provided in the static chuck, and helium gas flew into between the static chuck and the back surface of the semiconductor wafer. The helium gas was expected to eliminate a temperature difference between the central area and the peripheral area, if any, by carrying the heat from the low temperature area to the high temperature area. If the helium gas was perfectly sealed, the helium gas served as a heat carrier, and made the temperature uniform over the back surface of the semiconductor wafer. This resulted in the chemical reaction uniformly between the central area and the peripheral area regardless of the electrostatic attraction between the static chuck and the semiconductor wafer. However, the chemical reaction was unstable in the peripheral area rather than in the central area. The present inventor doubted that the helium gas was hermetically sealed between the static chuck and the semiconductor wafer, because the chemical reaction was varied together with the electrostatic attraction.

The present inventor installed a helium gas detector around the semiconductor wafer on the static chuck, and checks the helium gas detector to see whether or not the helium gas was leaked and whether or not the amount of leakage helium gas was varied with the electrostatic attraction between the static chuck and the semiconductor wafer. The detection proved the doubt to be correct.

In accordance with one aspect of the present invention, there is provided a dry etching system comprising a reactor having an etching chamber therein, a static chuck provided in the etching chamber and supplied with a direct current voltage so as to electrostatically attracting a single semiconductor wafer thereto, a gas control system supplying a process gas to the etching chamber and maintaining the pressure of the process gas at a target range, a plasma generator provided in the etching chamber and generating a plasma from the process gas in the vicinity of the single semiconductor wafer for a dry etching, and a process controlling system for supervising the dry etching and changing the direct current voltage between a standard value and a certain value different from the standard value on the basis of a place occupied by the single semiconductor wafer in a semiconductor wafer lot and a lapse of time from the previous dry etching.

In accordance with another aspect of the present invention, there is provided a method for a dry etching comprising the steps of a) conveying a single semiconductor wafer from a semiconductor wafer lot onto a static chuck, b) determining a magnitude of a direct current voltage to be applied to the static chuck on the basis of a place occupied by the single semiconductor wafer in the semiconductor wafer lot and a lapse of time from the previous dry etching, c) getting ready for the dry etching through application of the direct current voltage to the static chuck for electrostatically attracting the single semiconductor wafer to the static chuck, and d) carrying out the dry etching on the single semiconductor wafer.

BRIEF DESCRIPTION OF THE DRAWINGS

The features and advantages of the dry etching system and the dry etching method will be more clearly understood from the following description taken in conjunction with the accompanying drawings in which.

DESCRIPTION OF THE PREFERRED EMBODIMENT

Figure 3:
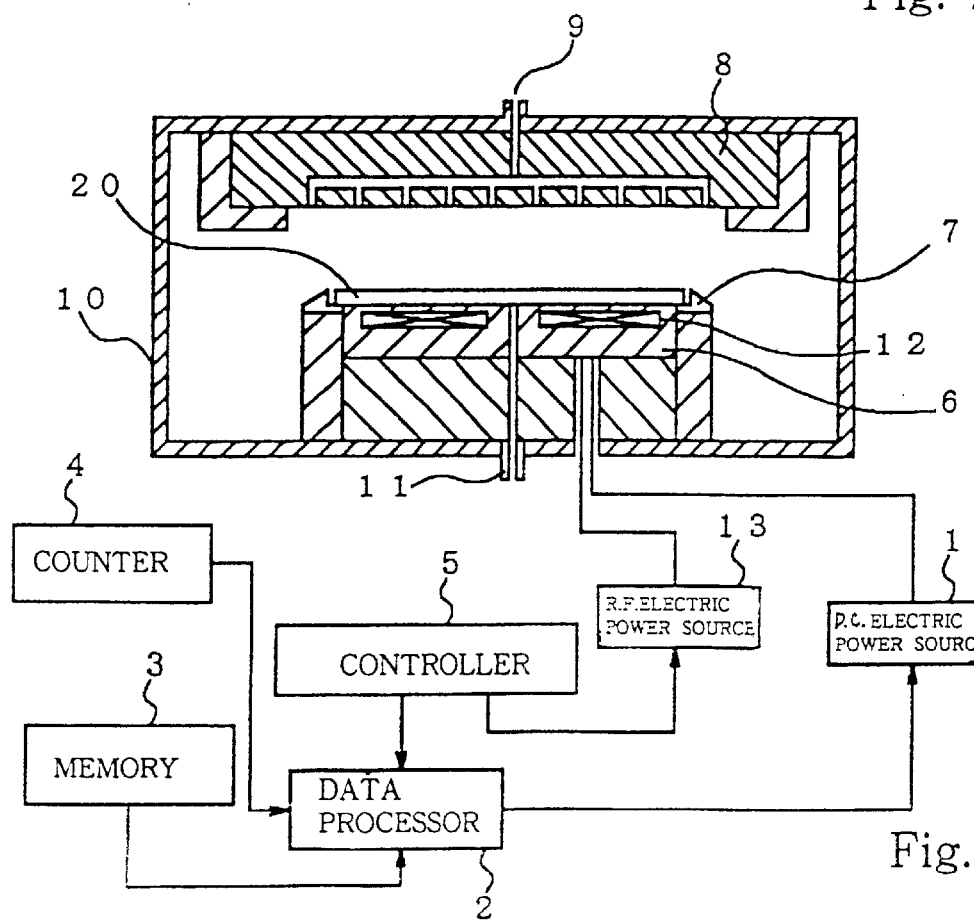
FIG. 3 is a schematic cross sectional view showing the arrangement of a dry etching system according to the present invention.

Referring first to FIG. 3 of the drawings, a dry etching system embodying the present invention comprises a hermetic reactor 10 and a controlling system, and an etching chamber is defined in the hermetic reactor 10. Although the hermetic reactor 10 is associated with a gas supply system and an evacuation system, the gas supply system and the evacuation system are similar to those of the prior art dry etching system, and are not shown in FIG. 3 for the sake of simplicity. A loading/unloading chamber (not shown) is contiguous to the etching chamber, and a wafer loader (not shown) and a wafer unloader (not shown) are installed in the loading/unloading chamber for conveying a semiconductor wafer 20 between the loading chamber and the etching chamber.

The dry etching system embodying the present invention further comprises an upper electrode 8 and a lower electrode structure opposed to the upper electrode 8. The upper electrode 8 and the lower electrode are accommodated in the etching chamber. A gas passage and gas outlet holes are formed in the upper electrode 8, and the gas supply system is connected through a gas inlet port 9 to the gas passage. While process gas is being supplied from the gas supply system to the gas inlet port 9, the process gas is blown from the gas outlet holes, and is supplied to the space between the upper electrode 9 and the lower electrode structure.

The lower electrode structure includes a static chuck 6, a stage cover 7 and a wafer heater 12. The static chuck is snugly received in a recess formed in a base structure, and the controller is connected to the static chuck 6. Gas passages are formed in the base structure and the static chuck 6. The gas supply system is connected through a gas inlet port 11 to the gas passage, which vertically extends in the base structure so as to be open to the recess. The gas passage formed in the static chuck also vertically extends, and is open to the upper surface of the static chuck 6. The gas passage in the base structure is aligned with the gas passage in the static chuck 6, and helium gas is supplied from the gas supply system through the gas passages to the upper surface of the static chuck 6.

A semiconductor wafer 20 is placed on the upper surface of the static chuck 6 by means of the wafer loader, and is electrostatically attracted to the static chuck 6. The helium gas is to be sealed between the static chuck 6 and the back surface of the semiconductor wafer 20. Though not shown in FIG. 3, a layer such as an insulating layer is deposited over the major surface of the semiconductor wafer 20, and a photo-resist etching mask is provided on the layer. The stage cover 7 is provided on the base structure around the semiconductor wafer 20, and is expected to prohibit the helium gas from flowing out.

The controlling system includes a direct current electric power source 1, a data processor 2, a memory 3, a counter 4, a controller 5 and an radio frequency electric power source 13. The direct current power electric source 1 is connected to the static chuck 6, and supplies the direct current voltage to the static chuck 6 so as to attract the semiconductor wafer 20 to the static chuck 6. The electrostatic attraction is dependent on the direct current voltage, and the direct current electric power source 1 can vary the direct current voltage applied to the static chuck 6 under the control of the data processor 2. The radio frequency electric power source 13 is connected to the static chuck 6 and the upper electrode 8, and the alternating current voltage is applied between the static chuck 6 and the upper electrode 8.

The controller 5 is connected to the radio frequency electric power source 13, the data processor 2, the wafer loader, the wafer unloader and other electric circuits for controlling the etching conditions such as, for example, the flow rate of the process gas and the temperature around the semiconductor wafer 20. The controller 5 instructs the radio frequency electric power source 13 to apply the alternating current voltage between the upper electrode 8 and the static chuck 6 so as to generate plasma in the space between the upper electrode 8 and the static chuck 6. The controller 5 supervises the dry etching. The controller 5 instructs the wafer loader/wafer unloader to convey the semiconductor wafer between the lot in the loading/unloading chamber and the static chuck 6. For this reason, the piece of control data information indicative of the place n of a target semiconductor wafer in the lot is stored in the controller 5. When the semiconductor wafer 20 on the static chuck 6 is changed, the controller 5 increments the place n of the target semiconductor wafer to be conveyed onto the static chuck 6, and supplies a control signal indicative of the place n of the semiconductor wafer 20 in the lot to the data processor 2. Furthermore, the controller 5 regulates the temperature in the static chuck 6 and the flow rate of the process gas and the pressure in the etching chamber. A piece of control data information representative of a standard direct current voltage Vs is stored in the controller 5, and is changeable. The controller 5 instructs the data processor 2 to determine appropriate direct current voltage V to be applied to the static chuck 6 for appropriately attracting the semiconductor wafers 20 to be treated with the dry etchant.

The counter 4 and the memory 3 are connected to the data processor 2. The counter 4 starts incrementing the value stored therein upon completion of the dry etching on the previous lot. The value stored therein is representative of the lapse of time T from the completion of the previous dry etching. The counter 4 produces a control data signal representative of the lapse of time T, and supplies the control data signal to the data processor 2.

On the other hand, pieces of control data information are stored in the memory 3. One of the pieces of control data information is representative of a corrective coefficient X appropriate to the first several semiconductor wafers in a lot. The piece of control data information, i.e., the corrective coefficient X is accessible by the data processor 2. Another of the pieces of control data information is representative of a critical lapse of time T1, and yet another piece of control data information is representative of a critical place N1 in each lot. If the dry etching system restarts the dry etching on the next lot at the expiry of the critical lapse of time T1 or before expiring the critical lapse of time T1, the data processor 2 instructs the direct current electric power source 1 to apply the standard direct current voltage Vs to the static chuck 6. On the other hand, when the dry etching system restarts the dry etching after expiry of the critical lapse of time T1, the data processor 2 fetches the corrective coefficient X from the memory 3, and calculates an appropriate direct current voltage V through the multiplication between the corrective coefficient X and the standard direct current voltage Vs for the semiconductor wafers before and at the critical place N1. The direct current voltage V is greater than the standard direct current voltage Vs. Accordingly, the semiconductor wafer 20 is strongly attracted to the static chuck 6. This results in that a large amount of heat is transferred from the static chuck 6 to the semiconductor wafer 20. However, the data processor 2 instructs the direct current power source 1 to apply the standard direct current voltage Vs to the static chuck 6 for the semiconductor wafers after the critical place N1. The critical lapse of time T1 and the critical place N1 are variable depending upon the conditions of dry etching. For this reason, the pieces of control data information are rewritablly stored in the memory 4.

Subsequently, description is made on a method of dry etching employed in the dry etching system. One to twenty-five semiconductor wafers 20 form the lot, i.e., a semiconductor wafer lot, and the semiconductor wafer lot is firstly conveyed to the loading/unloading chamber (not shown). The wafer loader (not shown) takes out the first semiconductor wafer 20, and carries the first semiconductor wafer 20 from the loading chamber onto the static chuck 6. The controller 5 supplies the control data signal representative of the first place n in the semiconductor wafer lot, i.e., the first place in the semiconductor wafer lot to the data processor 2. The counter 4 supplies the control data signal indicative of the lapse of time T to the data processor 2. The data processor 2 checks the pieces of control data information to see whether or not the standard direct current voltage Vs is appropriate to the semiconductor wafer 20 at the given place. If the standard direct current voltage Vs is appropriate to the semiconductor wafer 20 on the static chuck 6, the data processor 2 instructs the direct current electric power source 1 to apply the standard direct current voltage Vs to the static chuck 6. On the other hand, when the standard direct current voltage Vs is not appropriate to the semiconductor wafer 20 on the static chuck 6, the data processor 2 determines a direct current voltage V, and instructs the direct current electric power source 1 to change the direct current voltage from Vs to V.

The evacuating system starts developing vacuum in the etching chamber, and the etching chamber reaches a predetermined vacuum. Then, process gas is supplied from the gas supply system (not shown) to the gas inlet port 9, and flows from the gas outlet holes. Then, the process gas is spread over the etching chamber, and the evacuating system keeps the etching chamber at the predetermined vacuum.

When the dry etching was completed on the final semiconductor wafer 20 of the previous semiconductor wafer lot, the counter 4 starts incrementing the value stored therein, and continuously increments the value until the initiation of the dry etching on the first semiconductor wafer 20 of the next semiconductor wafer lot. For this reason, the lapse of time from the dry etching on the previous lot to the dry etching on the present lot is stored in the counter 4. The counter 4 reports the lapse of time to the data processor 2. The data processor checks the lapse of time to see whether or not the standard direct current voltage is appropriate to the semiconductor wafer lot. If appropriate, the data processor 2 instructs the direct current electric power source 1 to apply the standard direct current voltage Vs to the static chuck 6. However, if the lapse of time T is longer than the critical lapse of time T1, the data processor 2 calculates the direct current voltage V. The data processor 2 instructs the direct current electric power source 1 to change the direct current voltage from the standard value Vs to the value V, and repeats the calculation until the semiconductor wafer 20 at the critical place N1. Thereafter, the data processor 2 instructs the direct current electric power source 1 to change the direct current voltage to the standard value Vs. Thus, the electrostatic attraction is varied so as to attract the semiconductor wafer 20 to the static chuck 6.

The heater 12 maintains the static chuck 6 at a target temperature, and the thermal energy is transferred from the static chuck 6 to the semiconductor wafer 20. The helium gas makes the temperature uniform over the back surface of the semiconductor wafer 20. The stage cover 7 is as cold as the static chuck 6 before the generation of the plasma. While the radio frequency electric power source 13 is applying the radio frequency electric power between the upper electrode 8 and the static chuck 6, the plasma is created between the upper electrode 8 and the static chuck 6, and the semiconductor wafer 20 and the stage cover 7 are subjected to the ion-bombardment. The ion-bombardment gives rise to temperature rise in the stage cover 7. The layer of the semiconductor wafer 20 is selectively etched, and micro-contact holes are formed in the layer. Upon completion of the dry etching, the first semiconductor wafer 20 is conveyed from the static chuck 6 to the loading/unloading chamber. The other semiconductor wafers 20 in the same lot are treated with the dry etchant in a similar manner to the first semiconductor wafer 20.

Figure 4:
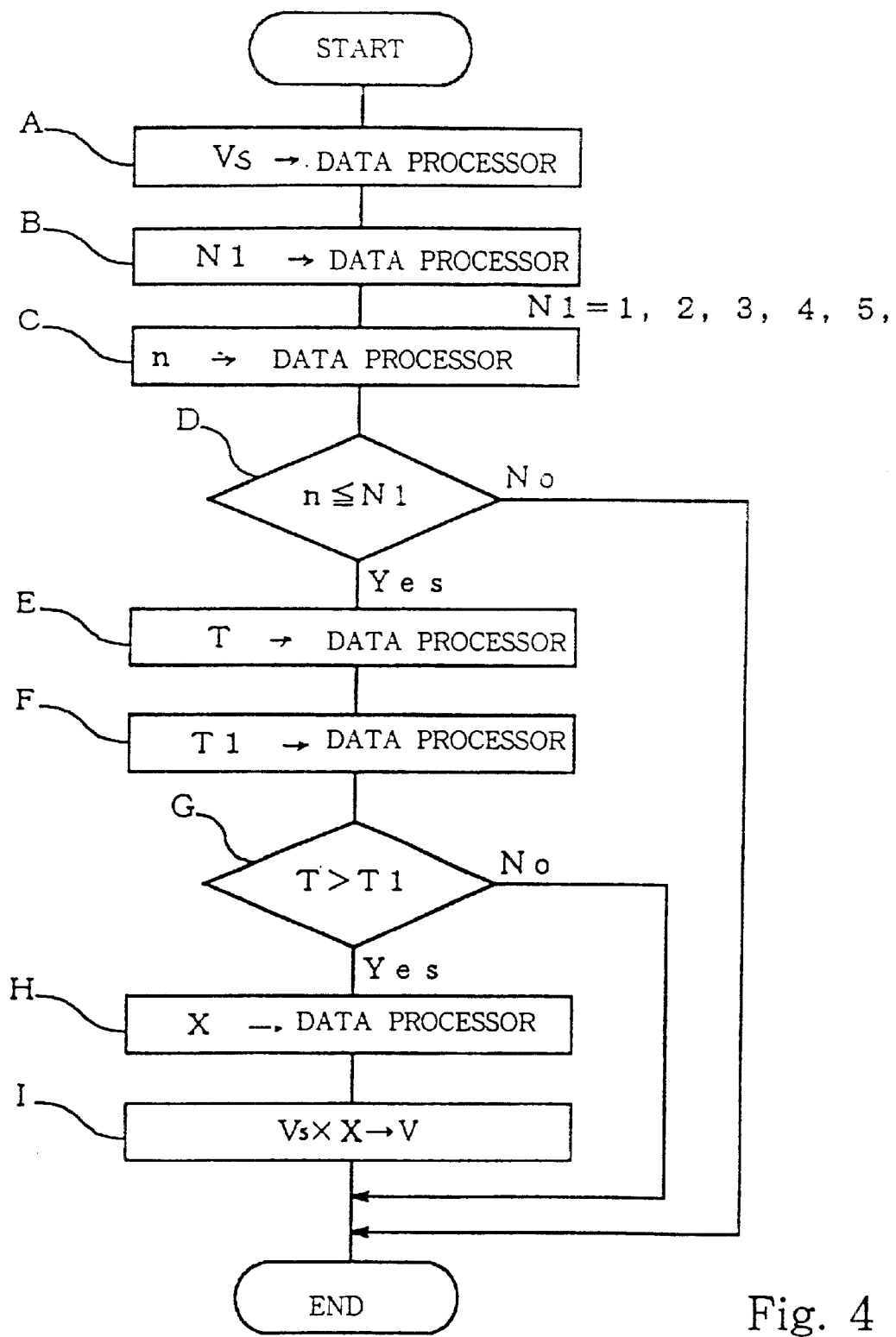
FIG. 4 is a flowchart showing a method for a dry etching according to the present invention.

FIG. 4 shows the behavior of the controlling system. The controller 5 regulates the radio frequency electric power, the flow rate of the process gas, the temperature in the static chuck 6 and the pressure in the etching chamber to appropriate values, respectively. Then, the controlling system starts the sequence shown in FIG. 4.

The controller 5 supplies the control data signal representative of the standard direct current voltage Vs to the data processor 2 as by step A, and the data processor 2 fetches the piece of control data information representative of the critical place N1 in the semiconductor wafer lot from the memory 3 as by step B. The controller 5 further supplies the control data signal representative of the place n of the semiconductor wafer 20 to be treated with the dry etchant as by step C. When the first semiconductor wafer 20 is to be treated with the dry etchant, the place is "1". The place n is incremented with the semiconductor wafers 20 in order.

The data processor 2 checks the pieces of control data information to see whether or not the place n is equal to or less than the critical place N1 as by step D. When the first semiconductor wafer 20 is to be treated with the dry etchant, the answer is given affirmative, and the data processor 2 proceeds to step E. The counter 4 supplies the control data signal representative of the lapse of time T to the data processor 2 at step E, and the data processor 2 fetches the piece of control data information representative of the critical lapse of time T1 from the memory 3 as by step F.

The data processor 2 checks the pieces of control data information to see whether or not the lapse of time T is longer than the critical lapse of time T1 as by step G. If the lapse of time T is equal to or shorter than the critical lapse of time T1, the answer at step G is given negative, and the data processor 2 terminates the data processing 2 for the direct current voltage V. The data processor 2 instructs the direct current electric power source 1 to apply the standard direct current voltage Vs to the static chuck 6.

If, on the other hand, the lapse of time T is longer than the critical lapse of time T1, the answer at step G is given affirmative, and the data processor 2 proceeds to step H. The data processor 2 fetches the corrective coefficient X for the place n from the memory 3 as by step H, and multiplies the standard direct current voltage Vs by the corrective coefficient X. The product is representative of the direct current voltage V to be applied to the static chuck 6. Then, the data processor 2 instructs the direct current electric power source 1 to apply the direct current voltage V to the static chuck 6.

The data processor 2 reiterates the loop consisting of steps C, D, E, F, G, H and I until the answer at step D is given negative. When the place n passes the critical place N1, the chemical reaction becomes stable, and the data processor 2 continuously instructs the direct current electric power source 1 to apply the standard direct current voltage Vs to the static chuck 6.

Figure 5:
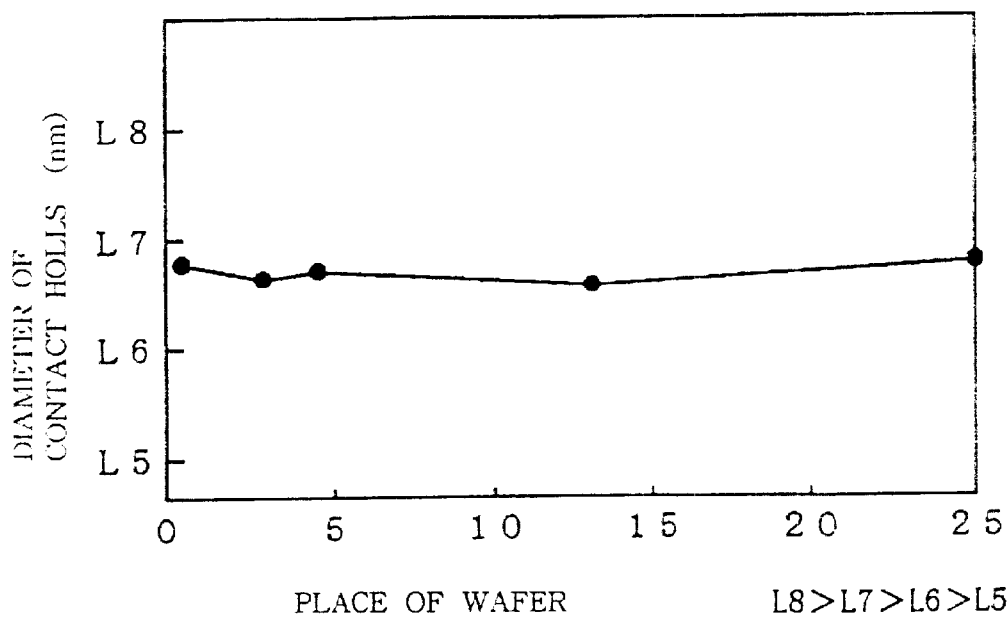
FIG. 5 is a graph showing the variation in diameter of micro-contact holes formed in layer on semiconductor wafers treated in order.
Figure 1:
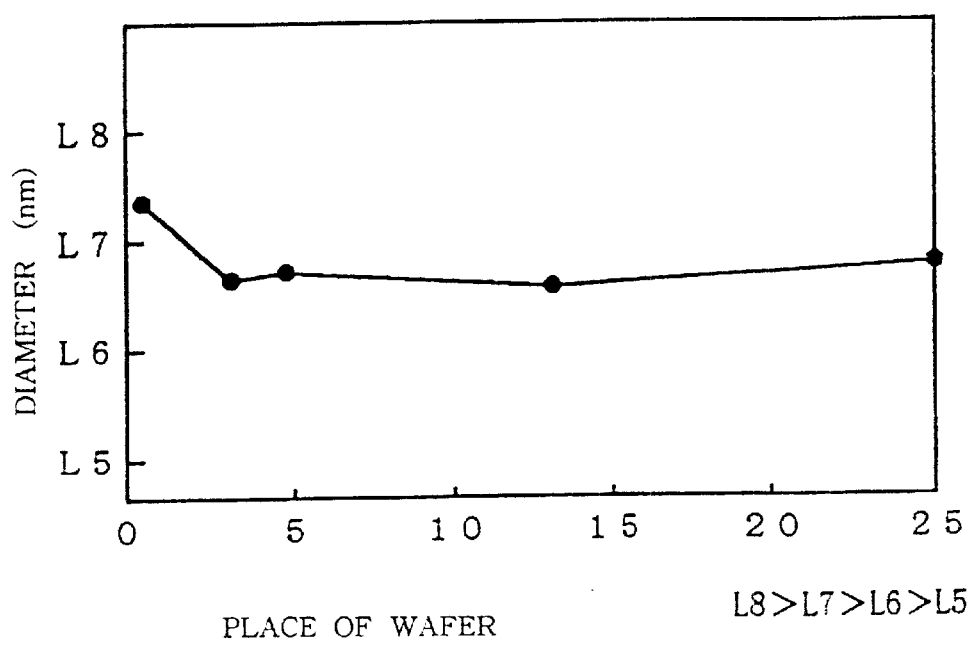
FIG. 1 is a graph showing the variation in the diameter of micro-contact holes formed over the semiconductor wafers treated in order.
Figure 2:
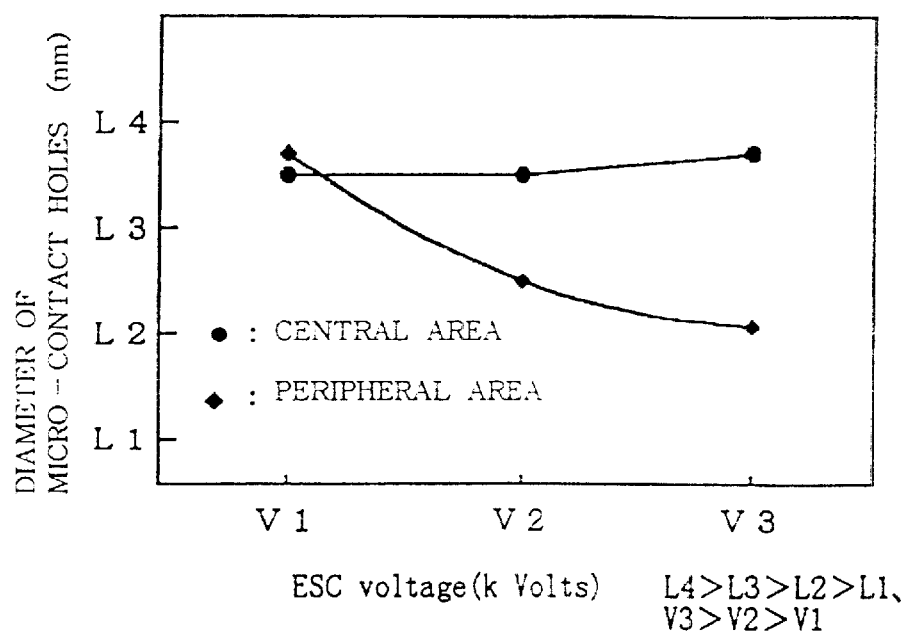
FIG. 2 is a graph showing the variation in the diameter of micro-contact holes in terms of the direct current voltage applied to the static chuck.

The present inventor evaluated the method of dry etching. The present inventors prepared a semiconductor wafer lot consisting of twenty-five semiconductor wafers. The present instructs the controller 5 to increase the direct current voltage V for several semiconductor wafers in case where the lapse of time T was longer than the critical lapse of time T1. Upon completion of the dry etching on the several semiconductor wafers, the direct current voltage was reduced to the standard value Vs. The dry etching was carried out on all the semiconductor wafers 20 in the semiconductor wafer lot for forming micro-contact holes. The present inventor measured the diameter of the micro-contact holes, and plotted the diameter in FIG. 5. The micro-contact holes were fallen within the target range.

As will be understood from the foregoing description, the direct current voltage is increased for the first several semiconductor wafers in each lot so as to strongly attract the semiconductor wafers to the static chuck 6. As a result, the semiconductor wafer 20 on the static chuck 6 is rapidly heated, and the dry etchant forms a target pattern in the layers on the semiconductor wafers 20. In other words, the dispersion is eliminated from the patterned layers. Any dummy wafer is not required, and the throughput is never lowered. Thus, the reproducibility is improved without sacrifice of the throughput by using the dry etching according to the present invention.

In the above-described embodiment, the memory 3, the counter 4 and the controller 5 as a whole constitute a source of data information.

Although particular embodiments of the present invention have been shown and described, it will be apparent to those skilled in the art that various changes and modifications may be made without departing from the spirit and scope of the present invention.

For example, the corrective coefficient X may be varied with the place n of the semiconductor wafer to be treated with the dry etchant. In this instance, the direct current voltage V is appropriately varied for the first several semiconductor wafers, and the micro-contact holes are fallen within a range narrower than that of the above-described embodiment. The number of semiconductor wafers attracted in the direct current voltage stepwise varied may be 5 at the maximum. The relation between the corrective coefficient X and the place n may be tabled in the memory 3.

The corrective coefficient X or the set of corrective coefficients may be varied with the lapse of time T. The longer the lapse of time, the wider the dispersion. The lapse of time may be divided into the first group within 5 minutes, the second group from 5 minutes to 15 minutes, the third group from 15 minutes to 30 minutes, the fourth group from the 30 minutes to an hour and the fifth group longer than an hour so as to vary the corrective coefficient X or the set of corrective coefficients among the groups.

What is claimed is:

1. A method for a dry etching, comprising the steps of:
   a) conveying a single semiconductor wafer from a semiconductor wafer lot onto a static chuck,
   b) determining a magnitude of a direct current voltage to be applied to said static chuck on the basis of a place occupied by said single semiconductor wafer in said semiconductor wafer lot and a lapse of time form the previous dry etching,
   c) getting ready for said dry etching through application of said direct current voltage to said static chuck for electrostatically attracting said single semiconductor wafer to said static chuck, and
   d) carrying out said dry etching on said single semiconductor wafer.

2. The method as set forth in claim 1, in which said dry etching is carried out under the condition where said static chuck is heated in said step c).

3. The method as set forth in claim 2, in which a heat carrier gas is supplied to between said single semiconductor wafer and said static chuck in said step c).

4. The method as set forth in claim 1, in which said magnitude of said direct current voltage is larger than a standard value when said lapse of time is longer than a critical lapse of time and when said place is equal to or less than a critical place.

5. The method as set forth in claim 4, in which said direct current voltage is regulated to said standard value if said lapse of time is equal to or shorter than said critical lapse of time or if said place is greater than said critical place.

6. The method as set forth in claim 1, in which said step b) includes the sub-steps of
   b-1) determining said place and said lapse of time,
   b-2) comparing said place and said lapse of time with a critical place and a critical lapse of time, respectively, to see whether or not said place is equal to or less than said critical place and whether or not said lapse of time is longer than said critical lapse of time, and
   b-3) giving a relatively large magnitude to said direct current voltage when said place is equal to or less than said critical place and when said lapse of time is longer than said critical lapse of time and a relatively small magnitude to said direct current voltage if said place is greater than said critical place or if said lapse of time is equal to or shorter than said critical lapse of time.

7. The method as set forth in claim 6, in which said relatively large magnitude is equal to the product of a multiplication between said relatively small magnitude and a corrective coefficient.

8. (Amended) The method as set forth in claim 7, in which said corrective coefficient is varied together with said place occupied by said single semiconductor wafer until said critical place.

9. (Amended) The method as set forth in claim 7, in which said corrective coefficient is varied together with a time period from said completion of said previous dry etching until said critical lapse of time.

* * * * *